United States Patent [19]
Lifshitz et al.

[11] Patent Number: 5,550,397
[45] Date of Patent: Aug. 27, 1996

[54] METAL OXIDE SEMICONDUCTOR TRANSISTORS HAVING A POLYSILICON GATE ELECTRODE WITH NONUNIFORM DOPING IN SOURCE-DRAIN DIRECTION

[75] Inventors: Nadia Lifshitz; Serge Luryi, Both of Bridgewater, N.J.

[73] Assignee: Lucent Technologies Inc., Murray Hill, N.J.

[21] Appl. No.: 299,855

[22] Filed: Sep. 1, 1994

Related U.S. Application Data

[63] Continuation of Ser. No. 18,484, Feb. 16, 1993, abandoned.

[51] Int. Cl.$^6$ .......................... H01L 29/76; H01L 29/04; H01L 31/36; H01L 27/01
[52] U.S. Cl. .............. 257/412; 257/57; 257/66; 257/347
[58] Field of Search ................... 257/57, 59, 66, 257/72, 347, 348, 349, 350, 351, 352, 353, 354, 412

[56] References Cited

U.S. PATENT DOCUMENTS 4,862,237  8/1989  Morozumi ........................ 257/72

FOREIGN PATENT DOCUMENTS

| | | | |
|---|---|---|---|
| 0111347 | 6/1984 | European Pat. Off. | 257/339 |
| 0487022 | 5/1992 | European Pat. Off. | 437/41 |
| 2-27772 | 1/1990 | Japan | 257/347 |
| 2-68965 | 3/1990 | Japan | 257/66 |

OTHER PUBLICATIONS

Hayashi, F. et al., "A High Performance Polysilicon TFT Using RTA and Plasma Hydrogenation Applicable to Highly Stable SRAMs of 16Mbit and Beyond," 1992 *Symp. on VLSI tech. Digest of Tech. Papers*, pp. 36–37.

Tanaka, K. et al., "Characteristics of Offset-Structure Polycrystalline-Silicon Thin-Film Transistors," *IEEE Electron Device Lett.*, vol. 9, No. 1, Jan. 1988, pp. 23–25.

*Primary Examiner*—Steven H. Loke
*Attorney, Agent, or Firm*—David I. Caplan

[57] ABSTRACT

The gate electrode of a polysilicon gate MOS transistor—the transistor having either a thin film polysilicon substrate or a bulk monocrystalline substrate—has a pair of contiguous regions: a heavily doped gate electrode region near the source, and a lightly doped gate electrode region near the drain. The gate electrode region near the drain is thus doped significantly more lightly, in order to reduce electric fields in the channel region in the neighborhood of the drain (and hence reduce field induced leakage currents) when voltages are applied to turn transistor OFF. At the same time, sufficient impurity doping is introduced into the gate electrode region near the source in order to enable the transistor to turn ON when other suitable voltages are applied.

14 Claims, 1 Drawing Sheet

5,550,397

METAL OXIDE SEMICONDUCTOR TRANSISTORS HAVING A POLYSILICON GATE ELECTRODE WITH NONUNIFORM DOPING IN SOURCE-DRAIN DIRECTION

This application is a continuation of application Ser. No. 08/018,484, filed on Feb. 16, 1993, now abandoned.

FIELD OF THE INVENTION

This invention relates to semiconductor devices and more particularly to metal-insulator-semiconductor (MIS) transistor structures, especially those in which the insulator is an oxide and hence the transistors have MOS structures.

BACKGROUND OF THE INVENTION

An MIS transistor structure is useful, for example, as a load device in an inverter or in a static random access memory (SRAM) cell, the latter comprising a pair of cross-connected inverters. Such an MIS structure can be built on a monocrystalline bulk substrate ("bulk" transistor), or it can be built in a polycrystalline semiconductor film located on a dielectric substrate such as glass or quartz ("thin film" transistor or TFT). An array of MIS transistors, especially TFTs, is also useful as access (control) transistors to an array of light emitting areas such as liquid crystal pixels.

A serious problem that arises during circuit operation of MIS transistors, particularly those MIS transistors that are implemented in polycrystalline silicon, stems from high electric fields in the neighborhood of the drain region. These high electric fields are undesirable in the case of polycrystalline thin film transistors because the fields cause undesirably high OFF currents by the mechanism of field emission via crystal grain boundary trapping states. In the case of monocrystalline bulk transistors, these high electric fields generate undesirable hot carriers which cause premature transistor failure. A commonly used remedy for alleviating the effects of high field near the drain is to reduce the maximum field by removing the effective edge of the drain electrode from under the gate, i.e., by separating the edge of the gate and the effective edge of the drain by a setback distance. These techniques are known under the names "lightly doped drain" (for bulk transistors) and "drain offset" (for TFFs). A disadvantage of these techniques is in an unwanted decrease of the source-drain current in the ON state of the transistor, owing to the added series resistance introduced by the lightly doped drain or the drain offset, respectively.

SUMMARY OF THE INVENTION

In order to alleviate the foregoing problem, an MIS (or MOS) transistor structure comprises:
 (a) source and drain regions located in the semiconductor and spaced apart by an intermediate region, located in the semiconductor, of length L,
 (b) a polycrystalline semiconductor gate electrode layer located on the insulator and consisting essentially of first and second contiguous gate electrode regions,
  the first gate electrode region extending from a first location overlying an edge of the source region to an edge of the second gate electrode region,
  the second gate electrode region extending to a second location overlying an edge of the drain region,
  the second gate electrode region containing an average impurity doping concentration C2 and the first gate electrode region containing an average impurity doping concentration C1 such that the ratio C1/C2 is equal to 10 or more.

It is also advantageous that the structure further comprises a gate contact layer directly physically contacting the first gate electrode region,
 such that when a first voltage is $V_{ON}$ applied to the gate contact layer, both the first and second gate electrode regions go into states of electronic charge accumulation, while a conducting channel is formed (ON condition) in the semiconductor at an interface with the insulator extending from the edge of the source region to the edge of the drain region,
 such that when a second voltage $V_{OFF}$ is applied to the gate contact layer, the first gate electrode region remains in an electrically conductive state and the second gate electrode region goes into a state of depletion, while the conducting channel is extinguished (OFF condition) and the electric field in the semiconductor, underlying the second gate region, in a neighborhood of the edge of the drain region is reduced by virtue of the complete depletion of the second gate electrode region—the second gate electrode region having the lower average impurity concentration. That is to say, the second gate electrode region behaves like an insulating layer in the OFF condition of the transistor. The conducting channel can be an inversion layer in a monocrystalline bulk transistor or can be either a channel inversion layer or an accumulation layer in a thin film transistor.

It is also advantageous that the gate electrode layer is substantially aligned with the edges of the source and the drain regions, whereby the gate electrode layer has a length approximately equal to L. It is also advantageous that the gate electrode layer comprises polycrystalline silicon. It is also advantageous that the second gate electrode region has an average impurity doping concentration that is equal to or less than $10^{17}$ per cubic centimeter.

As used herein, the term "impurity doping concentration" describes the excess of an intentionally introduced concentration of impurity atoms over any compensating concentration of dopant atoms of complementary type and of any other compensating defects. As known in the art, the compensating defects are commonly present in semiconductor devices such as a TFT.

It is also advantageous that the first gate electrode region has an average impurity doping concentration that is approximately equal to at least $10^{18}$ per cubic centimeter. It is further advantageous that the insulator is silicon dioxide. It is yet further advantageous that a utilization means is coupled to, for example, the drain region of the structure. And it is also advantageous that, for example, a dc voltage source is coupled to the source region. It is advantageous that the ratio C1/C2 is greater than 10, preferably greater than 100.

Although it should be understood that the theory of the invention is not essential to the successful operation of the inventive transistor structure, it is believed that the unwanted leakage current is reduced in the invention by virtue of a reduction of electric fields in the neighborhood of the drain region when, for example, a voltage $V_{OFF}$ is applied to the gate contact layer to turn the transistor OFF—this reduction being achieved by the low impurity doping concentration in the (overlying) second gate electrode region, viz., a concentration that is low enough to produce electronic charge depletion in the second gate electrode region when $V_{OFF}$ is being applied. On the other hand, the impurity doping concentration in the first gate electrode region is sufficiently high to enable this region to be in a state of electrical conduction when $V_{OFF}$ is being applied. Moreover, when a voltage $V_{ON}$ is applied to the gate contact layer to turn the transistor ON, a state of electronic charge accumulation spreads quickly from the first through the second gate electrode region, facilitated by a simultaneous formation of a charged channel in the underlying semiconductor, including that portion thereof underlying the second gate electrode region. Thus the nonuniform gate-electrode-doping profile in the source-drain direction reduces the unwanted leakage current without reducing the ON current of the transistor structure.

DETAILED DESCRIPTION OF THE DRAWINGS

Figure 1:
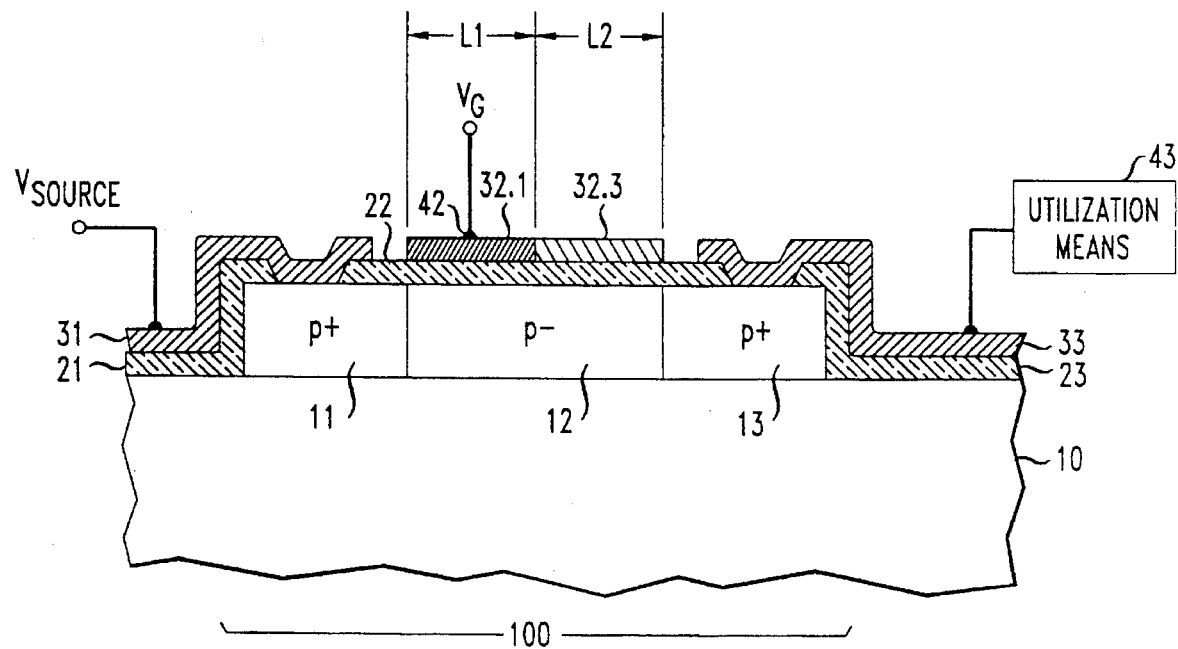

FIG. 1 is a cross-sectional elevational diagram of a transistor structure, together with electric-circuit connections, in accordance with a specific embodiment of the invention.

DETAILED DESCRIPTION

Referring to FIG. 1, a MIS thin-film transistor structure 100 has a source electrode 31 coupled to a voltage source $V_{SOURCE}$, typically equal to +3.3 volt, and a drain electrode 33 coupled to a utilization means 43, typically either logic circuitry, or a bit line of an SRAM array via an n-channel access transistor, or a region of a light-emitting layer such as a liquid crystal layer. Alternatively, the drain electrode 33 can be coupled to the utilization means 43.

The structure 100 is built on an insulating substrate 10, typically silicon dioxide, glass, or quartz. On a major surface of the substrate 10 is located a semiconductor thin film composed of three p-type conductivity thin-film regions: heavily impurity-doped $p^+$ source and drain thin-film regions 11 and 13, respectively, and an intervening lightly doped $p^-$ thin-film region 12. Alternatively, the thin-film region 12 can be undoped or lightly doped ($n^-$) conductivity. As used herein, the term "heavily" doped signifies approximately at least $1\times10^{18}$ (1E18) impurities per cubic centimeter, and the term "lightly" doped signifies no more than approximately 1E17 impurities per cubic centimeters. The semiconductor thin-film regions 11 and 13 typically are polycrystalline silicon.

On the top major surface of the semiconductor thin-film region 12 is located a gate insulating layer 22 that extends over a portion of each of the top major surfaces of the source and drain regions 11 and 13. A source insulating layer 21 is located between the source region 11 and the source electrode 31, and a drain insulating layer 23 is located between the thin-film drain region 13 and the drain electrode 33. The source and drain insulating layers 21 or 23 are useful for passivating the underlying source and drain thin-film regions 11 and 13, respectively.

On the top major surface of the gate insulating layer 22 is located a semiconductive gate electrode layer that has two gate electrode regions 32.1 and 32.3, having lengths L1 and L2, respectively. Typically both L1 and L2 are equal to or greater than approximately 0.4 μm. The left-hand edge of the gate electrode region 32.1 is aligned with the right-hand edge of the source region 11, and the right-hand edge of the gate electrode region 32.3 is aligned with the left-hand edge of the drain region 13.

The net concentration of donor impurities in the gate electrode region 32.1 (i.e., the gate electrode region that is proximate the source region 11) is typically in the approximate range of 1E18-to-1E21 per cubic centimeter, advantageously at least approximately 1E19. The net concentration of donor impurities in the gate electrode region 32.3 (i.e., nearer the drain region 13) is typically in the approximate range of 1E14-to-1E17 per cubic centimeters, preferably equal to or less than approximately 1E16. A gate contact layer 42, typically aluminum, enables application of a gate voltage $V_G$, typically equal to approximately +3.3 volt to turn OFF the transistor structure 100 and to approximately 0.0 volt (ground) to turn it ON while $V_{SOURCE}$ is maintained at +3.3 volt.

In order to fabricate the transistor structure 100, in an illustrative case, an amorphous silicon film of uniform thickness is deposited everywhere on the top surface of the insulating substrate 10—typically at a temperature in the approximate range of 500° C. and 550° C.—and preferably is treated by an anneal—typically at a temperature in the approximate range of 600° C. and 650° C. for approximately 20 hours. (The anneal produces polycrystalline silicon having grain sizes in the approximate range of 0.5 μm to 1.5 μm.) Next, a first silicon dioxide (gate insulating) layer is deposited, such as by means of a standard chemical vapor deposition process at a temperature below approximately 800° C., on the then-exposed top surface of the polycrystalline silicon thin film substrate. Then a polysilicon electrode layer is deposited everywhere on the silicon dioxide layer and is subjected to an implantation of donor impurities, such as arsenic or phosphorus, to the extent of a net donor impurity concentration not exceeding 1E17 per cubic centimeter. Next, a patterned resist mask is formed on the top surface of the polysilicon electrode, the mask having an aperture located in, and only in, the areas overlying where the first gate electrode region 32.1 is to be situated. Then further donor impurity ions are implanted into the gate electrode as thus masked, whereby the first gate electrode region attains a net donor impurity concentration of the order of 1E19 per cubic centimeter.

The resist mask is then removed ("stripped"). Then, by means of another suitably patterned resist mask and an etch, the gate electrode edges are defined and formed. Keeping this suitably patterned resist mask in place, acceptor impurities such as boron are implanted into the exposed portions of the top surface of the thin film substrate, whereby self-aligned source and drain regions are formed in this substrate. Next, by means of further masking with resist followed by etching, the physical edges of the thin film polycrystalline substrate are defined and delineated. Then, after stripping the resist, a second silicon dioxide layer is deposited, as by chemical vapor deposition at a temperature below approximately 800° C., everywhere over the top surface. This second silicon dioxide layer is then patterned by masking with resist followed by etching, whereby contact holes are formed in it. The resist is stripped and the source, drain and gate contacts are formed, typically by means of evaporation or sputtering of aluminum, followed by lithographic patterning of the aluminum.

Although the invention has been described in detail with respect to a specific embodiment, various modifications can be made without departing from the scope of the invention. For example, p-type conductivity semiconductor can be replaced with n-type, and at the same time donor impurities are replaced with acceptor impurities in the gate electrode regions 32.1 and 32.3. Moreover, instead of the thin-film structure 100, the transistor structure of this invention can be built in a monocrystalline semiconductor substrate, in which case L2 can be reduced to a lower value, typically 0.05 μm to 0.10 μm. Instead of silicon dioxide, silicon nitride or silicon oxynitride or a combination thereof can be used for the gate insulating layer 22. Finally, instead of polycrystalline silicon amorphous silicon can be used for the thin-film regions 11, 12, and 13 (as by omitting the anneal).

We claim:

1. A metal insulator thin-film-polysilicon semiconductor transistor structure comprising:

(a) source and drain regions located in the thin-film-polysilicon semiconductor and spaced apart by an intermediate region, located in the thin-film-polysilicon semiconductor, of length L, the intermediate region and the source and drain regions forming a thin-film polysilicon structure, (b) the insulator located on the intermediate region, (c) a polycrystalline semiconductor gate electrode layer located on the insulator and consisting essentially of first and second contiguous gate electrode regions, (d) an insulating substrate having a top major surface contiguous with a bottom major surface of the intermediate region and with the source and drain regions, the first gate electrode region, having a first average impurity doping concentration, extending from a first location overlying an edge of the source region to an edge of the second gate electrode region, the second gate electrode region, having a second average impurity doping concentration, extending from the edge of the second gate electrode region to a second location overlying an edge of the drain region, the ratio of the first to the second average impurity doping concentration being equal to at least 10, and the first gate electrode region having a conductivity type opposite to that of the source drain.

2. The structure of claim 1 further including an utilization means coupled to the drain region.

3. The structure of claim 1 further comprising a gate contact layer directly physically contacting the first gate electrode region, whereby, when a first voltage is applied to the gate contact layer, both the first and second gate electrode regions go into states of electronic charge accumulation, while a conducting channel is formed in the semiconductor at an interface with the insulator extending from the edge of the source region to the edge of the drain region, and whereby, when a second voltage is applied to the gate contact layer, the first gate electrode region goes into an electrically conductive state and the second gate electrode region remains in a state of depletion, while the conducting channel is extinguished and the electric field in the semiconductor, underlying the second gate electrode region, in a neighborhood of the edge of the drain region is reduced by virtue of a depletion of the second gate electrode region.

4. The structure of claim 3 further including an utilization means coupled to the drain region.

5. The structure of claim 3 in which the gate electrode layer is substantially aligned with the edges of the source and the drain regions, whereby, the gate electrode layer has a length approximately equal to L.

6. The structure of claim 5 further including an utilization means coupled to the drain region.

7. The structure of claim 5 in which the ratio is greater than approximately 100.

8. The structure of claim 7 further including an utilization means coupled to the drain region.

9. The structure of claim 1 in which the second average impurity doping concentration of the second gate electrode region is equal to or less than approximately $10^{17}$ per cubic centimeter.

10. The structure of claim 9 further including an utilization means coupled to the drain region.

11. The structure of claim 9 in which the first average impurity doping concentration of the first gate electrode region is approximately at least $10^{19}$ per cubic centimeter.

12. The structure of claim 11 further including an utilization means coupled to the drain region.

13. The structure of claim 1, 3, 5, 7, 9 or 11 in which the insulator comprises silicon dioxide.

14. The structure of claim 2, 4, 6, 8, 10 or 12 in which the insulator comprises silicon dioxide.

* * * * *